United States Patent
Re et al.

(10) Patent No.: US 6,489,664 B2
(45) Date of Patent: Dec. 3, 2002

(54) PROCESS FOR FABRICATING INTEGRATED MULTI-CRYSTAL SILICON RESISTORS IN MOS TECHNOLOGY, AND INTEGRATED MOS DEVICE COMPRISING MULTI-CRYSTAL SILICON RESISTORS

(75) Inventors: Danilo Re, Bernareggio (IT); Massimo Monselice, Offanengo (IT); Paola Maria Granatieri, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/866,074

(22) Filed: May 24, 2001

(65) Prior Publication Data

US 2001/0023966 A1 Sep. 27, 2001

Related U.S. Application Data

(62) Division of application No. 09/209,909, filed on Dec. 11, 1998, now Pat. No. 6,261,916.

(30) Foreign Application Priority Data

Dec. 12, 1997 (EP) .............................................. 97830663

(51) Int. Cl.[7] .......................................... H01L 29/8605
(52) U.S. Cl. ....................................... 257/538; 438/385
(58) Field of Search ................................ 257/536, 537, 257/538; 438/385

(56) References Cited

U.S. PATENT DOCUMENTS

| | | | |
|---|---|---|---|
| 4,290,185 A | 9/1981 | McKenney et al. ............ 29/571 |
| 5,013,678 A | 5/1991 | Winnerl et al. ................ 437/52 |
| 5,185,285 A | 2/1993 | Hasaka ......................... 437/60 |
| 5,391,906 A | 2/1995 | Natsume ....................... 257/379 |
| 5,554,873 A | 9/1996 | Erdeljac et al. .............. 257/380 |
| 5,780,349 A | 7/1998 | Naem ........................... 438/305 |
| 5,838,044 A | * 11/1998 | Chang et al. |
| 5,852,311 A | * 12/1998 | Kwon et al. |
| 5,904,512 A | 5/1999 | Chang et al. ................ 438/158 |
| 5,970,338 A | 10/1999 | Tempel ........................ 438/241 |
| 5,977,598 A | * 11/1999 | Chen et al. |
| 6,011,293 A | * 1/2000 | Yuzuriha et al. |
| 6,252,268 B1 | * 6/2001 | Roberts |

FOREIGN PATENT DOCUMENTS

EP 0 272 433 6/1988

\* cited by examiner

*Primary Examiner*—Wael Fahmy
*Assistant Examiner*—Joannie Adelle Garcia
(74) *Attorney, Agent, or Firm*—Lisa K. Jorgenson; E. Russell Tarleton; SEED IP Law Group PLLC

(57) ABSTRACT

A fabrication process and an integrated MOS device having multi-crystal silicon resisters are described. The process includes depositing a multi-crystal silicon layer on top of a single-crystal silicon body; forming silicon oxide regions on top of the multi-crystal silicon layer in zones where resistors are to be produced; depositing a metal silicide layer on top of and in contact with the multi-crystal silicon layer so as to form a double conductive layer; and shaping the conductive layer to form gate regions, of MOS transistors. During etching of the double conductive layer, the metal silicide layer on top of the silicon oxide regions is removed and the silicon oxide regions form masking regions for the multi-crystal silicon underneath, so as to form resistive regions having a greater resistivity than the gate regions.

9 Claims, 2 Drawing Sheets

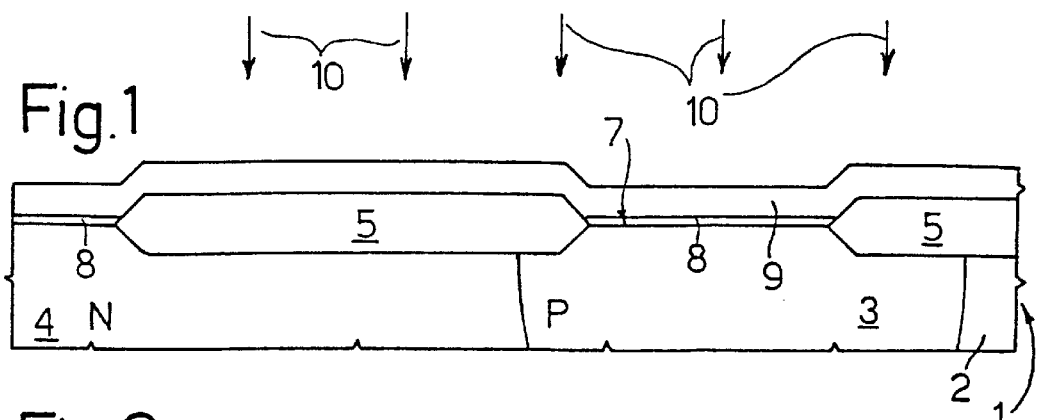
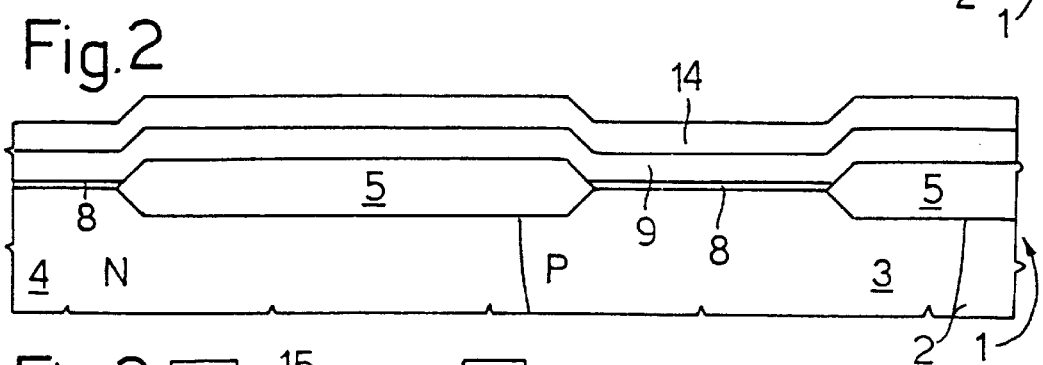
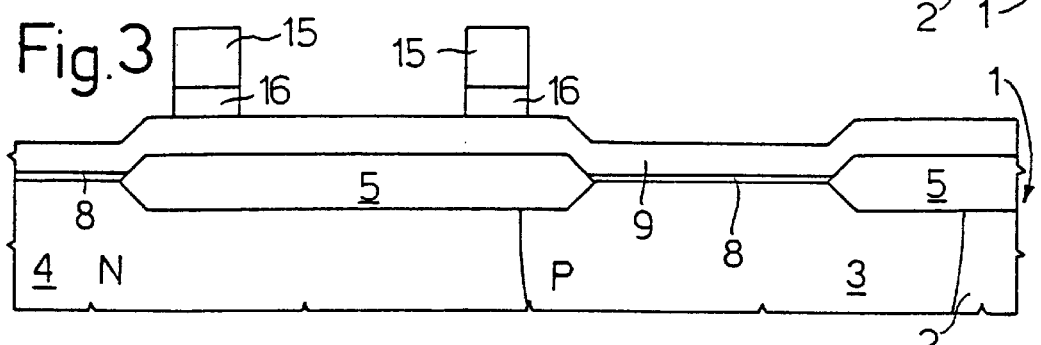
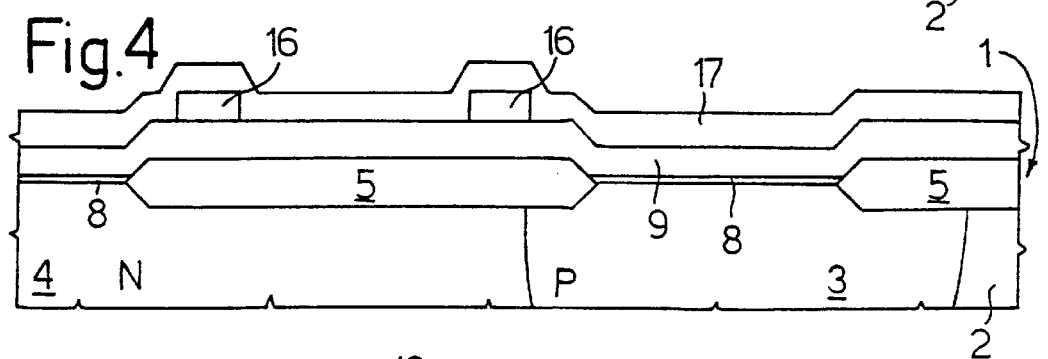
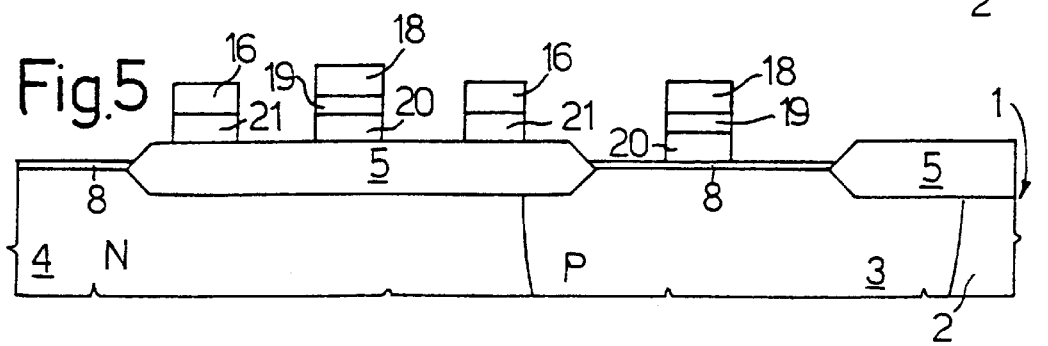

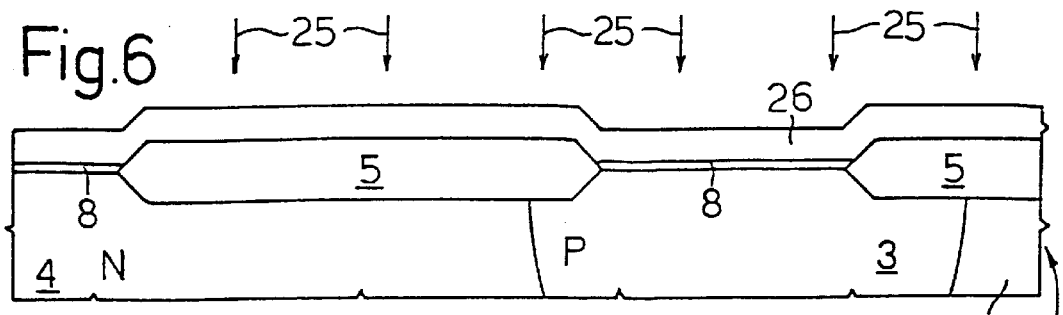
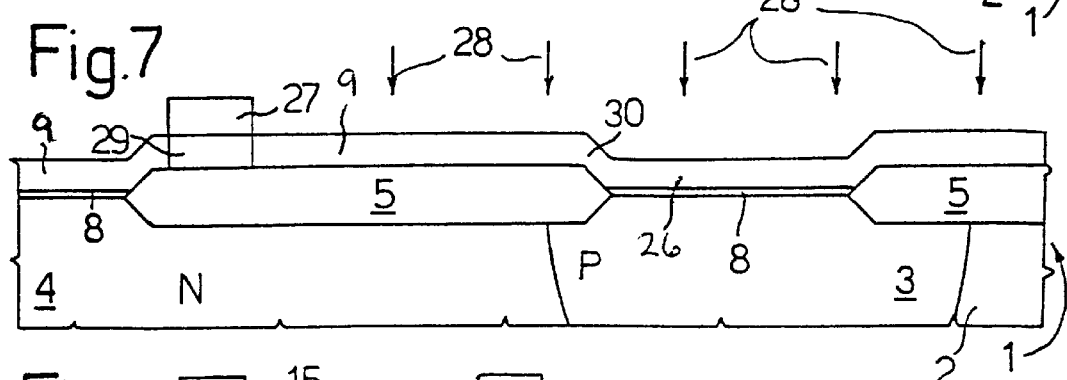
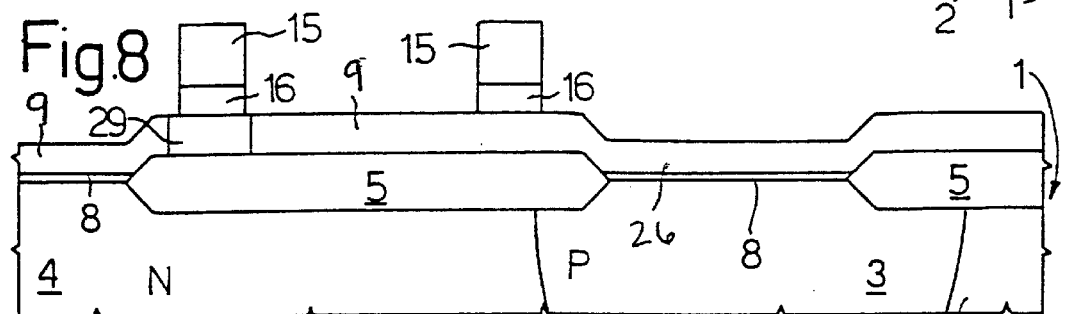
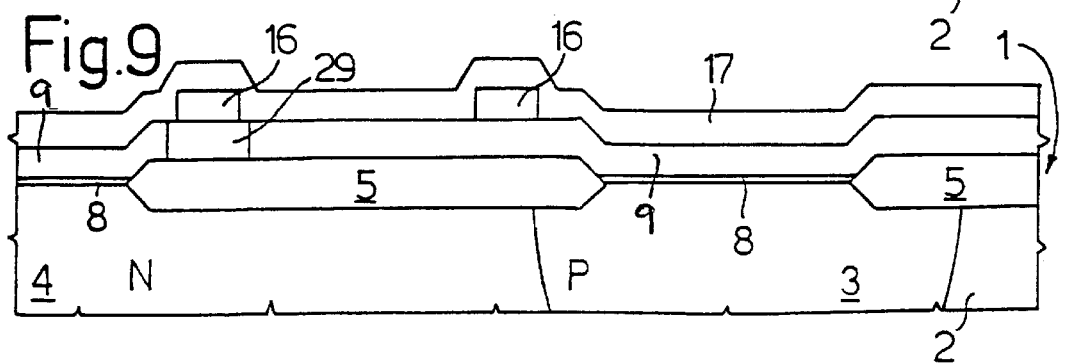
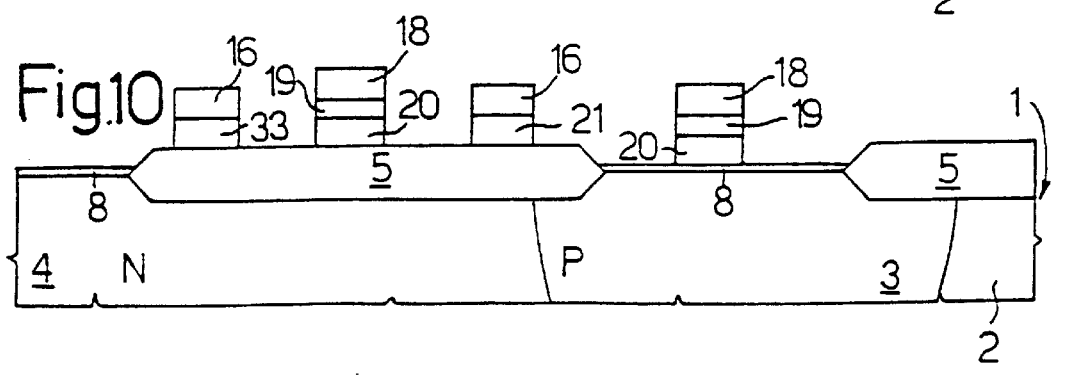

PROCESS FOR FABRICATING INTEGRATED MULTI-CRYSTAL SILICON RESISTORS IN MOS TECHNOLOGY, AND INTEGRATED MOS DEVICE COMPRISING MULTI-CRYSTAL SILICON RESISTORS

CROSS-REFERENCE TO RELATED APPLICATION

This application is a Divisional of pending U.S. patent application Ser. No. 09/209,909, filed Dec. 11, 1998, and allowed Mar. 13, 2001 and now U.S. Pat. No. 6,261,916.

TECHNICAL FIELD

The invention relates generally to integrated circuits and their fabrication, and more particularly to a process for fabricating integrated resistors of multi-crystal silicon in MOS technology and an integrated MOS device comprising multi-crystal silicon resistors.

BACKGROUND OF THE INVENTION

CMOS technologies are known in which a silicide layer of low resistivity is used to form the gate electrodes of transistors. With these technologies there is the problem of also integrating resistive components of multi-crystal silicon (polysilicon) which may have resistivity values higher than those of the gate electrodes by one or more orders of magnitude.

In particular, this problem arises when, together with logic functions with high switching speed (devices operating at frequencies of the order of several tens of MHz or more), it is necessary also to integrate analog functions which often require multi-crystal silicon resistors with higher resistivity values (typically>20–200 Ohms/square or even of the order of several KOhms/square in particular applications).

For example, in case of ADC converters in which voltage dividers are required having good linearity properties and not too demanding from the point of view of the space occupied in the layout, manufacturing of multi-crystal silicon resistors is often regarded as the best; on the other hand this technique is not applicable to processes for digital devices, where the low resistance of signal lines is an important requirement.

The technological difficulties of such integration are well understood given the process flow and the architecture of a typical CMOS process using silicide gate electrodes. As is well known, the material of the gate lines is a composite material obtained by superimposing a high-resistivity (typically 20–200 Ohms/square) multi-crystal silicon layer and a silicide layer of a metal which generally has a low resistivity value (such as tungsten silicide with a resistivity equal to approximately 5 Ohms/square). Since this composite material is shaped by a single masking step, it is currently impossible to distinguish the two layers and the resistive components which can be obtained inevitably have the low resistivity value of the composite material.

The above-mentioned difficulties are still greater where resistors of very high value (e.g., between 10 and 100 KOhms) are to be integrated. In view of the stringent linearity and accuracy requirements, these components would have to be produced through long multi-crystal silicon strips and would require considerable space in the layout. To remedy this disadvantage it is known to manufacture resistors, in addition to those normally available in a CMOS process, of multi-crystal silicon with resistivity of the order of several KOhms/square. At the present time, such high-value resistors are integrated using a specific polysilicon masking and subsequent doping step before defining the gate lines, so as to locally shield normal doping (with $POCl_3$ or implant) and leaving such areas with the concentration of dopant previously received through a suitable ion implantation step. In this way, multi-crystal silicon strips for the gate lines with a resistivity of the order of tens of Ohms/square together with resistors strips with resistivity of the order of several KOhms/square can be obtained at the same time by the known process.

For the reasons outlined above, this process is entirely incompatible with a MOS process using a silicide layer and constitutes a limit to optimization of the design of devices in terms of both performance and dimensions.

SUMMARY OF THE INVENTION

In accordance with the present invention, a process is provided for fabricating integrated multi-crystal silicon resistors in a MOS device. The process includes depositing a multi-crystal silicon layer on a single-crystal silicon body. The multi-crystal silicon is doped a first time, and selective portions of the multi-crystal silicon are then masked. The multi-crystal silicon is then doped a second time, with the selective portions then having a conductivity lower than adjacent portions of the multi-crystal silicon. Masking regions are then formed on the multi-crystal silicon layer prior to forming a metal silicide layer on and in contact with the multi-crystal silicon layer. The metal silicide layer and multi-crystal silicon layer then form a double conductive layer which is etched to form gate regions.

In accordance with the process of the present invention, an integrated MOS device is produced that includes a gate region having a first resistivity, a first resistive element having a second resistivity, and a second resistive element having a third resistivity. The third resistivity is greater than the second resistivity, which in turn is greater than the first resistivity.

One advantage of the invention is that both low-resistivity gate lines and multi-crystal silicon resistive components with higher resistivity values can be readily provided in MOS integrated devices.

BRIEF DESCRIPTION OF THE DRAWINGS

For an understanding of the invention, two preferred embodiments will now be described, purely by way of non-exhaustive example, with reference to the accompanying drawings.

FIGS. 1–5 show cross-sections through a semiconductor material wafer in successive manufacturing steps, according to a first embodiment of the invention.

FIGS. 6–10 show cross-sections through a semiconductor material wafer in successive manufacturing steps, according to a second embodiment of the invention.

DETAILED DESCRIPTION OF THE INVENTION

A first embodiment of the process relating to the manufacture of resistors with medium-high resistance (e.g., $\leq 1$ KOhm) will be described below with reference to FIGS. 1–5.

In detail, FIG. 1 shows a cross-section of a silicon wafer 1 comprising a substrate 2, already subjected to the preliminary manufacturing steps according to a CMOS process. In particular, P-type and N-type wells have been formed in substrate 2 (P-well and N-well denoted by 3 and 4 in FIG.

1); the active areas have been defined; field oxide regions 5 have been grown; a gate oxide layer 8 has been grown on the surface 7 of the wafer 1, and a multi-crystal silicon layer has been deposited thereon. The multi-crystal silicon layer is then doped, as shown by arrows 10 in FIG. 1 and by analogy with the known process; doping may be carried out either with normal treatments in doping furnaces (in which the silicon is typically doped with phosphorus obtained by dissociation of the molecule of POCl3 in the presence of O2), or with ion implantation techniques. In known manner, doping parameters may be regulated so as to provide resistivity values of 20–400 Ohms/square, preferably of 30–200 Ohms/square, or other suitable resistivity values according to the requirements of particular design specifications. Inter alia, this resistivity is suitable for producing resistors with medium-low values mentioned. The intermediate structure of FIG. 1, in which the doped multi-crystal layer is denoted by 9, is thus obtained.

After doping, a silicon oxide layer 14 (FIG. 2) is deposited, preferably by chemical vapor deposition (CVD); a mask 15 (FIG. 3) is then produced, having portions covering the silicon oxide layer 14, the shape and geometrical dimensions (width and length) of which correspond to those of the resistors to be produced. Using this mask 15, the uncovered portions of the silicon oxide layer 14 are removed, obtaining the structure of FIG. 3 in which the remaining portions of the layer 14 are denoted by 16.

After removal of mask 15, a silicide layer 17 (FIG. 4) is deposited and a mask 18 formed to define the transistor gate regions (FIG. 5). Then, using mask 18, the uncovered portions of silicide layer 17 and of polysilicon layer 9 are etched and removed. In view of the high etching selectivity silicide/polysilicon with respect to silicon oxide, this etching enables the double layer 9+17 at the sides of the transistors gate regions and the silicide layer 17 on top of the oxide portions to be removed, leaving areas of multi-crystal silicon covered by the oxide portions 16 unchanged. The structure of FIG. 5 is thus obtained, wherein the portions of the layers 17 and 9 forming the transistor gate regions (in active area) and low-resistivity interconnection structures (extending on top of field oxide regions 5) are denoted by 19 and 20 and the portions of the doped multi-crystal layer 9 beneath oxide portions 16 are denoted by 21. Portions 21 (arranged on top of field oxide regions 5) form the desired resistors with medium-high resistance.

Subsequently the process continues with conventional steps for manufacturing CMOS transistors including doping source and drain areas of the transistors, depositing an insulating dielectric layer; opening contacts both in the areas of standard components and on the terminal parts of the resistors 21 and the successive steps form forming the metallic interconnections, passivation etc.

A second embodiment of the process relating to the manufacture of resistors with high-value resistivity (e.g., >1 KOhm) will now be described with reference to FIGS. 6–10. In FIGS. 6–10 the parts similar to the first embodiment according to FIGS. 1–5 have been denoted by the same reference numbers.

The manufacturing process according to the second embodiment begins with the same process steps described above, as far as deposition of multi-crystal silicon layer. Subsequently, multi-crystal silicon layer is subjected to a blanket boron implantation step (with a concentration of $10^{14}$ at/cm$^2$ for example), as indicated in FIG. 6 by arrows 25; a doped layer 26 with a resistivity between 500 Ohms/square and 3 KOhms/square inclusive, typically 2 KOhms/square, is thus obtained. Of course, those skilled in the art understand that a variety of doping concentrations may be employed, and a corresponding variety of resistivity values achieved, as suitable to particular integrated circuit designs and associated processes.

Doped layer 26 is then masked by means of a mask 27 which covers the areas in which the high-value resistors are to be produced, and an N+-type doping step is carried out (indicated in FIG. 7 by arrows 28) similar to the doping step described with reference to FIG. 1 and having, inter alia, the purpose of compensating P-type doping carried out previously. The structure of FIG. 7 is thus obtained, in which the portion of doped layer 26 covered by mask 27 is not influenced by doping 28 and forms a low-doping region 29; the remainder of layer 26, not covered by mask 27, forms a layer again denoted by 9 by analogy with the preceding embodiment.

Subsequently, and by analogy with the above, an oxide layer is deposited, masked (mask 15) and etched, leaving only the portions 16 which define the resistors, some of which have a lateral extent less than and contained within the lateral extent of the low-doping region 29 (i.e., having slightly smaller area, as shown in FIG. 8). Silicide layer 17 is then deposited (FIG. 9); mask 18 is formed; and double layer 17+9 is etched where exposed. By analogy with FIG. 5, the zones of double layer 17+9 covered by mask 18 give rise to low-resistivity portions 19, 20 and the zone of layer 9 beneath oxide portion 16 (masked by the latter) gives rise to a portion 21 defining a resistor of medium-high resistivity, as described below. Furthermore, the portion of region 29 underneath oxide portion 16 forms a region 33 having the same doping as region 29 but of slightly smaller dimensions. Region 33 thus forms a resistor of high resistance (e.g., >1 KOhm, up to several hundred KOhms).

Conventional final steps, already referred to above, then follow. The resulting structure thus comprises both a resistor of medium-high value (formed by region 21) and a resistor of high value (formed by region 33).

The advantages of the described process are as follows. Firstly, it enables resistive components to be produced with a higher value than that of current CMOS fabrication processes, providing gate regions including a silicide layer, with dimensions and layout which are acceptable in the micro-electronics field, thus increasing the range of components available to designer in CMOS technology, without altering the performance of the other components and hence reliability of the integrated device.

The process only requires the addition of a number of simple technological steps which do not introduce significant difficulties into production control, and do not involve high costs. In particular, as it does not require heat treatments other than CVD deposition and etching of the silicon oxide layer the process may be adopted without interfering with standard CMOS fabrication processes.

Finally it will be clear that numerous modifications and variants may be introduced to the method described and illustrated herein, all of which come within the scope of the invention as described in the accompanying claims. For example, for both the embodiments described above, instead of by direct deposition, silicide layer 17 may be obtained by depositing a metal layer (titanium) and causing the metal to react with the silicon by a chemical reaction activated by an RTA (Rapid Thermal Annealing) treatment, similar to current practice with salicization processes carried out in a successive step of the manufacturing process, after the source and drain junctions have been produced.

Obtaining the silicide layer in the above manner has the advantage of exploiting the selectivity of the chemical reaction generating titanium silicide, which does not take place in the presence of oxide. In this way, the absence of silicide on the areas covered with oxide also prevents possible delamination effects which could occur if a deposition step were used, as described with reference to FIGS. 4 and 9. In this case, otherwise, the chemical reaction which forms compound $TiSi_2$ provides for a heat treatment which may cause modifications to some junction profiles already present in this step; on the other hand, such modifications may easily be recovered with slight corrections to the ion implantation doping steps.

It will be appreciated that, although specific embodiments of the invention have been described for purposes of illustration, various modifications may be made without deviating from the spirit and scope of the invention. For example, the above-described doping concentrations, resistivity values, resistance values, and particular process flow details may well vary depending upon particular integrated circuit designs and associated fabrication processes. Accordingly, the invention is not limited by the particular disclosure above, but instead the scope of the invention is determined by the following claims.

What is claimed is:

1. An integrated MOS device, comprising:
    a single-crystal silicon body;
    gate regions including a region of a polysilicon layer and a metal silicide layer arranged on the polysilicon region and insulated from said single-crystal silicon body by first isolating regions, said gate regions having a first resistivity and the polysilicon region accommodating first and second doping impurities and having a second resistivity greater than the first resistivity; and
    a first resistive element formed of regions of the polysilicon layer and a conductive layer and a second resistive element formed of the polysilicon layer and arranged on and insulated from said single-crystal silicon body by second isolating regions, said first resistive element accommodating the first and second doping impurities and having the second resistivity, and said second resistive element accommodating only the first doping impurity and having a third resistivity higher than said second resistivity, wherein said first resistive element and said second resistive element extend on top of field isolating regions and the first and second impurities are of an opposite conductivity type.

2. A device according to claim 1 wherein said second resistivity is between 20 and 400 Ohms/square.

3. A device according to claim 1 wherein said third resistivity is between 500 and 3000 Ohms/square.

4. An integrated circuit, comprising:
    a semiconductor substrate;
    first and second insulation regions on the substrate;
    a first resistive region including a first portion of a polycrystalline semiconductor layer, the first portion of the polycrystalline semiconductor layer accommodating first and second doping impurities and separated from the substrate by the first insulation region, the first resistive region having a first resistivity;
    a second resistive region including a second portion of the polycrystalline semiconductor layer, the second portion of the polycrystalline semiconductor layer accommodating only the first doping impurity and separated from the substrate by the first insulation region, the second resistive region having a second resistivity less than the first resistivity; and
    a gate region including a conductive layer and a third portion of the polycrystalline semiconductor layer, the third portion of the polycrystalline semiconductor layer accommodating the first and second doping impurities to have the second resistivity and separated from the substrate by the second insulation region, the gate region having a third resistivity less than the second resistivity 5. The integrated circuit of claim 4 wherein the first and second insulation regions include field-oxide and gate oxide layers, respectively.

6. The integrated circuit of claim 4 wherein the polycrystalline semiconductor layer includes a polysilicon layer.

7. The integrated circuit of claim 4 wherein the polycrystalline semiconductor layer includes a polysilicon layer, and wherein the conducting layer includes a metal silicide layer.

8. The integrated circuit of claim 4 wherein the first and second doping impurities are of opposite type.

9. The integrated circuit of claim 4, wherein the first doping impurity is of N type and the second doping impurity is of P type.

* * * * *